United States Patent [19]

Jackson

[11] 4,074,142
[45] Feb. 14, 1978

[54] OPTICAL CROSS-POINT SWITCH

[76] Inventor: Albert S. Jackson, 1335 Crestview, Seal Beach, Calif. 90740

[21] Appl. No.: 612,255

[22] Filed: Sept. 10, 1975

[51] Int. Cl.² ............................................. G02B 27/00
[52] U.S. Cl. .................................... 250/551; 250/578
[58] Field of Search ............... 250/199, 201, 208, 209, 250/578, 551; 340/173 LM, 173 LS, 173 LT, 365 P

[56] References Cited

U.S. PATENT DOCUMENTS

| | | | |
|---|---|---|---|
| 2,599,368 | 6/1952 | Bruce et al. | 250/199 |
| 2,855,539 | 10/1958 | Hoover | 340/173 LT |
| 3,432,675 | 3/1969 | Roby | 250/578 |
| 3,492,484 | 1/1970 | Ito | 250/199 |
| 3,604,936 | 9/1971 | Kompfner | 250/199 |
| 3,676,864 | 7/1972 | Maure et al. | 340/173 LM |
| 3,887,906 | 6/1975 | Minnava | 340/173 LM |
| 3,899,778 | 8/1975 | Roberts | 340/173 LT |
| 3,911,410 | 10/1975 | Ohta et al. | 250/578 |

Primary Examiner—David C. Nelms

Attorney, Agent, or Firm—Jackson & Jones

[57] ABSTRACT

An optical cross-point switch is disclosed which has the capability of connecting any of a multiplicity of input signals to any of a multiplicity of output lines, in any order in a non-interfering and non-blocking manner. The cross-point switch includes n input circuits (where n is an integer greater than one) and an output circuit associated with each input circuit. An n array of light emitting diodes is connected to each input circuit for transforming input electrical signals applied to the input circuits into optical radiation. A photosensor is connected to each output circuit for transforming incident optical radiation into output electrical signals. A lens, or fiber optic, system is disposed between the light emitting diodes and the photosensors for focusing optical radiations eminating from each array of diodes onto a separate photosensor. An input and output address decoding and selection circuit is coupled to each array of light emitting diodes to selectively enable one diode of each array so that each input circuit may be electro-optically coupled to a selected output circuit.

20 Claims, 7 Drawing Figures

FIG. 1.

FIG_3_

FIG_5_

OPTICAL CROSS-POINT SWITCH

BACKGROUND OF THE INVENTION

1. Field of the Invention

This invention relates to signal switching apparatus, and particularly, to cross-point or matrix type switches.

2. Description of the Prior Art

Present methods of controlling the interconnection electrical signal lines from one set of equipment to another include patch-boards, manually operated mechanical switches, electrically operated cross-bar switches, electrically operated relays, electrically operated rotary switches, electrically operated matrices of reed relays, and electronically operated semiconductor switches. The best known example of automatic switching systems are those used in the modern telephone system. A telephone central office contains a network of switching devices by means of which subscriber lines and trunks can be interconnected. Telephone line switching is usually accomplished with electromechanical relays, including reed relays, electromechanical crossbar switches, or, in some cases, semiconductor switches. The Bell System Electronic Switching System (ESS) is representative of the present state of the art in telecommunications switching systems. The ESS system uses reed type relays, where the contacts are mounted on thin strips or reeds of ferromagnetic material. The reeds and their contacts are encapsulated in a glass envelope and are controlled by an external magnetic coil. Operate and release times are in the 2 to 20 millisecond range. The reed relays are usually configured in an array termed a cross-point switch. Two reed relays are normally required for each cross-point. A 256 × 256 cross-point switch requires 65,536 cross-points and 131,072 reed relays.

Semiconductor electronic switches are now available to a limited degree. Such switches usually utilize metal oxide semiconductor (MOS) or silicon controlled rectifier (SCR) technology. Both MOS and SCR type switches are available as 4 × 4 cross-point arrays on a single chip. Larger arrays require suitable interconnection of the 4 × 4 arrays. A straightforward 256 × 256 cross-point switch would require 4,096 of the 4 × 4 arrays. Typical ON resistance of such switches is 10 to 100 ohms, with switching times of 0.2 to 3.0 microseconds.

It is the object of this invention to provide a novel and improved cross-point type switch which can handle the interconnection of large numbers of input and output signal lines with very high speed dynamic switching.

It is a further object to provide a cross-point switch which can be easily controlled by remote apparatus, such as a computer.

It is a further object of this invention to provide a switching apparatus which can handle on the order of 256 input lines and 256 output lines in a single level of switching and in such a way that the signal on any input line can be connected to any output line in any order, once the addresses of the input and output lines are received by the switching apparatus.

It is a further object of the invention to provide a switching means which does not depend upon mechanical contacts to make connections.

In many applications, it is desirable to isolate the inputs from the outputs in such a way that they have no electrical connections. Therefore, it is a further object of this invention to provide optical isolation of inputs from outputs.

Another object of this invention is to provide an inexpensive and reliable switch which can handle several hundred input and output signal lines in a simple, single level implementation.

In some applications, the signals to be switched are analog in nature, i.e., continuous, such as audio, while in other applications the signals are digital in nature, i.e., quantized to two levels, usually termed "one" and "zero". It is therefore an object of this invention to provide a switch which will handle either analog or digital signals.

In some applications, it is desirable to utilize a space-division switch in a time-sharing mode in which each input is time-shared with two or more signal sources. It is therefore an object of this invention to provide a space-division switch with very high switching speed, on the order of 100 nanoseconds, so that inputs may be time-shared with multiple signal sources.

SUMMARY OF THE INVENTION

In accordance with the present invention, an optical cross-point switch which includes a plurality of separate input circuits and a plurality of separate output circuits. An optical matrix is connected between the input and output circuits. The matrix includes a first set of light emitting units, i.e., diodes, and a second set of light sensor units, i.e., photosensor diodes. One of the first and second sets includes a number of n units and the other set includes a plurality of arrays of units, with each array having a number of n units therein. One unit in each array of the other set is associated with one unit of said first set. Each light emitting unit is arranged to convert an electrical signal into a light signal and each light sensor unit is arranged to convert a light signal back to an electrical signal. The light emitting and light sensor units are associated with individual input and output circuits, respectively. Means are provided for transmitting light signals between each unit of said first set and the associated unit in each array of the other set and means are included for selectively enabling one unit of each array to thereby connect each input circuit to a selected output circuit.

The novel features which are believed to be characteristic of the invention, both as to its organization and method of operation, together with further objects and advantages thereof, will be better understood from the following description considered in connection with the accompanying drawings in which an embodiment of the invention is illustrated by way of example. It is to be expressly understood, however, that the drawings are for the purpose of illustration and description only, and are not intended as a definition of the limits of the invention.

BRIEF DESCRIPTION OF THE DRAWINGS

FIG. 6 is a block diagram of another embodiment of the present invention in which one light emitting diode is connected to each input circuit and each array of photosensors is connected to a separate output circuit.

DESCRIPTION OF THE PREFERRED EMBODIMENT

Figure 1:
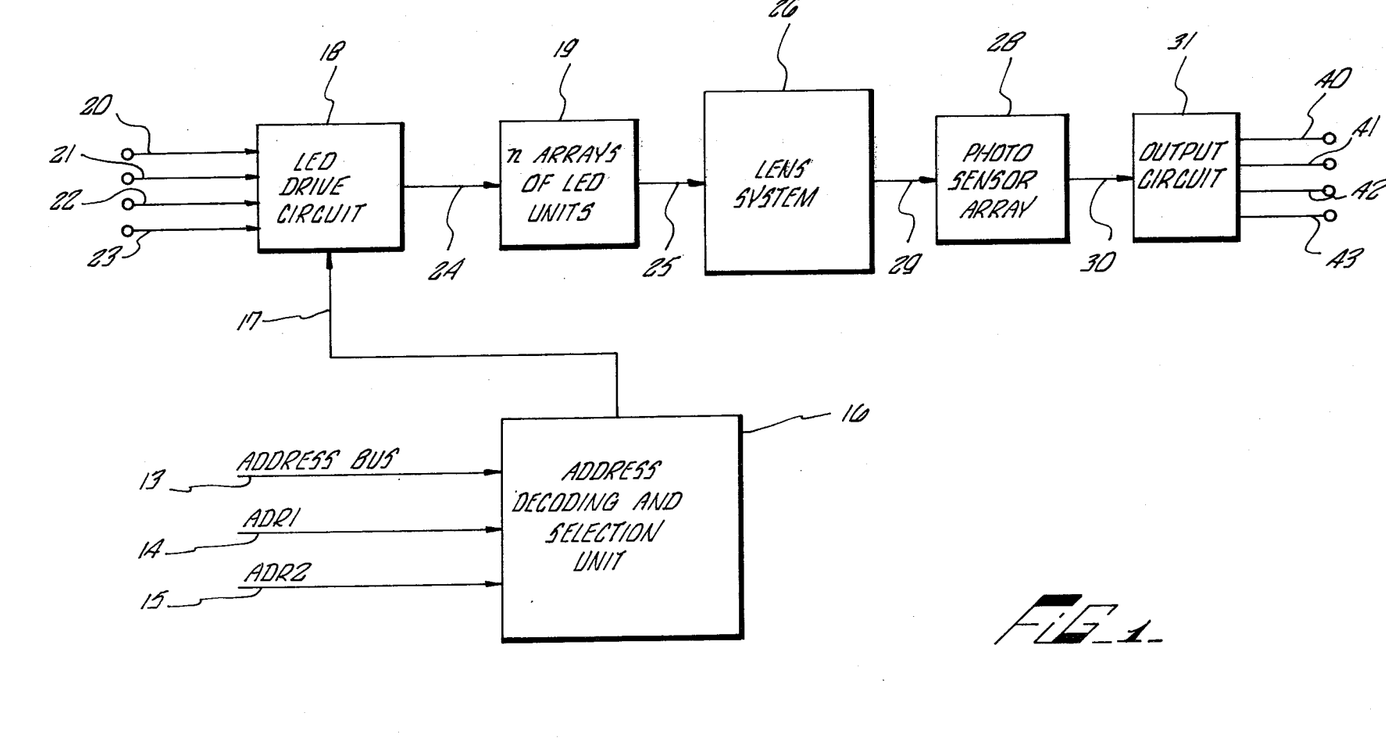
FIG. 1 is a simplified block diagram showing the principal units of the cross-point switch with an optical means of providing signal connections between inputs and outputs in accordance with the present invention.

Referring now to FIG. 1, there is shown therein a functional block diagram of the optical cross-point switch with an optical means for providing signal connections between input circuits and output circuits in accordance with the present invention. The switch includes an address decoding and selection unit 16, which receives address information from a remote unit, such as a computer or manual switches (not shown), on an address bus 13. Two control lines, 14 and 15, are also driven by the remote unit to inform the address decoding and selection unit 16 when valid input line and output line addresses are on the address bus 13. Signals from the address decoding and selection unit 16 on lines 17 control the Light Emitting Diode (LED) drive circuit 18 so that only a specified LED in each array of the transmitter element LED arrays 19 is enabled and driven by the associated input signal. The input signals to the LED drive circuit 18 are on input circuits or lines 20, 21, 22 and 23.

For each input line, there is an associated array of LEDs in the LED arrays assembly 19. In each LED array, there is one LED associated with each output line. The signals from the LED drive circuit 18 are applied to the selected LED units via lines 24. Light or infrared radiation 25 from each LED in an array is directed by a lens system 26 onto a corresponding receiving photosensor unit in a photosensor assembly 28. The output light beams 29 from the lens system 26 cause electrical current to flow in the photosensors receiving the light. These electrical currents on output lines 30 are amplified by an output circuit 31 to produce electrical signals on the output lines 40, 41, 42, and 43.

Only four input and four output circuits or lines are used here for illustration, but this is not to be considered a restriction in any sense upon the number of input and output lines possible. The number of input lines may be equal to less than, or greater than, the number of output lines. The letter $n$ in FIG. 1 refers to the number of light emitting units in each array associated with each input line. This number n must be equal to the number of photosensors or output circuits.

Switching is accomplished by selection (or enabling) of the proper LED in each LED array which converts the incoming electrical signal for that array to an optical radiation signal. Since the lens system 26 focuses the radiation from each LED onto a corresponding photosensor, the signal on any input line can be connected to any output line via signal paths 24, 25, 29, and 30. The result is a single level, space-division type cross-point switch. The switch is non-blocking in the sense that the connection of any input signal to any unused output line is never blocked by previously made connections of the remaining input signals. The diagram of FIG. 1 illustrates an undirectional switch. Two such systems can be used for a bidirectional switch with complete optical isolation of the electrical systems of the two input/output sets of equipment.

Figures 1, 2:
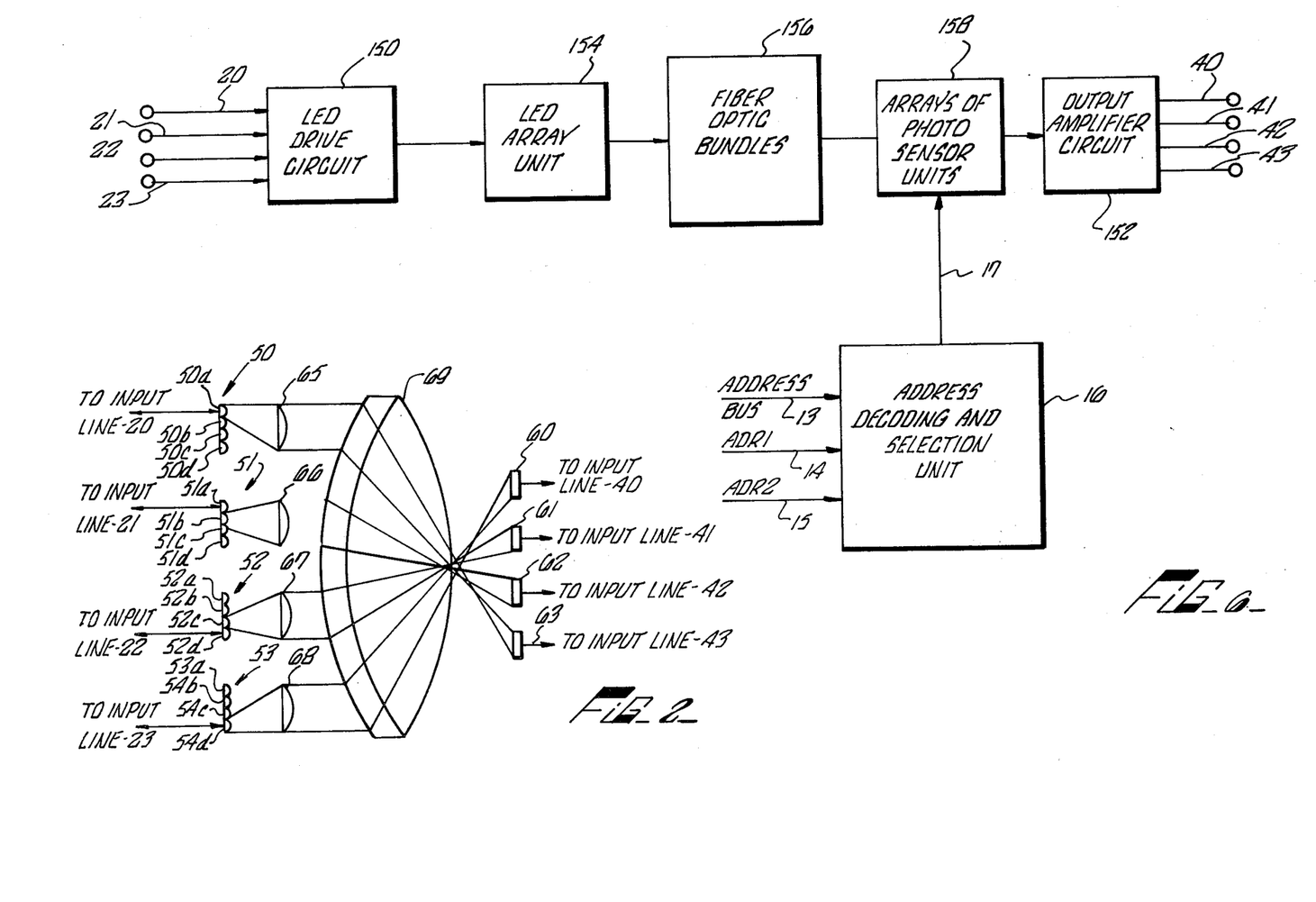
FIG. 2 is a diagram showing the basic way in which light paths are used to effect the input-output signal connections via the light emitting diode arrays, the lens system and the photo-sensor array shown in FIG. 1.

FIG. 2 illustrates the means whereby the optical radiation from the transmitter elements LEDs is focused through the lens system to accomplish the connection of input signals to the output lines. There is provided a LED array 50, 51, 52, and 53 for each input line 20, 21, 22, and 23 as shown. Each LED array is identical and consists of one LED for each receiving element photosensor 60, 61, 62, and 63. Each LED array is in the focal plane of a relay lens 65, 66, 67, and 68. An objective lens 69 focuses the light beams from lens 65 – 68 onto the individual photosensors 60 – 63, as illustrated. The photo-sensors are located in the focal plane of the objective lens 69. The LEDs in each LED array 50 – 53 have the same spacial orientation as the photosensors 60 – 63 in the photosensor array, with a spacing which is consistent with the magnification factor of the relay-objective lens combination and the spacing of the photosensors. Accordingly, there is a one-to-one correspondence with the individual LEDs and the individual photosensors. Referring again to FIG. 2, the radiation from the top LED 50a, 51a, 52a, and 53a in all four LED arrays 50 – 53, is focused upon photosensor 63. Similarly, the radiation from LEDs 50b, 51b, 52b, and 53b strike photosensor 62; the radiation from LEDs 50c, 51c, 52c, and 53c strike photosensors 61 and the radiation from LEDs 50d, 51d, 52d, and 53d strike photosensor 60. Electrical signals from the photosensors are supplied to the output lines 40 – 43 via output amplifier circuit. As illustrated in FIG. 2, the signal on input line 20 is connected through the switch to output line 63 by virtue of the fact that LED 50a has been enabled. Similarly, the signal on input line 21 drives LED 51b and is thereby connected through the lens system to photosensor 62, and hence, to output line 42. FIG. 2, also illustrates the signal on inputs 22 and 23 being connected in a similar manner to output lines 61 and 60, respectively.

It will be noted that the resulting switch is single level and is non-blocking. Connection of the signal on any input line is accomplished simply by selection, within the associated LED array, of the proper LED to be driven by the input signal. Two or more input signals may be combined or time multiplexed onto the same output line. Since inexpensive LEDS and photosensors are available which have rise and fall times on the order of 10 nanoseconds, the switching speed can be very fast and the signal bandwidth quite broad. The high speed switching inherent in this invention also makes possible the time-multiplexing of multiple signal sources on each input line.

Figure 3:
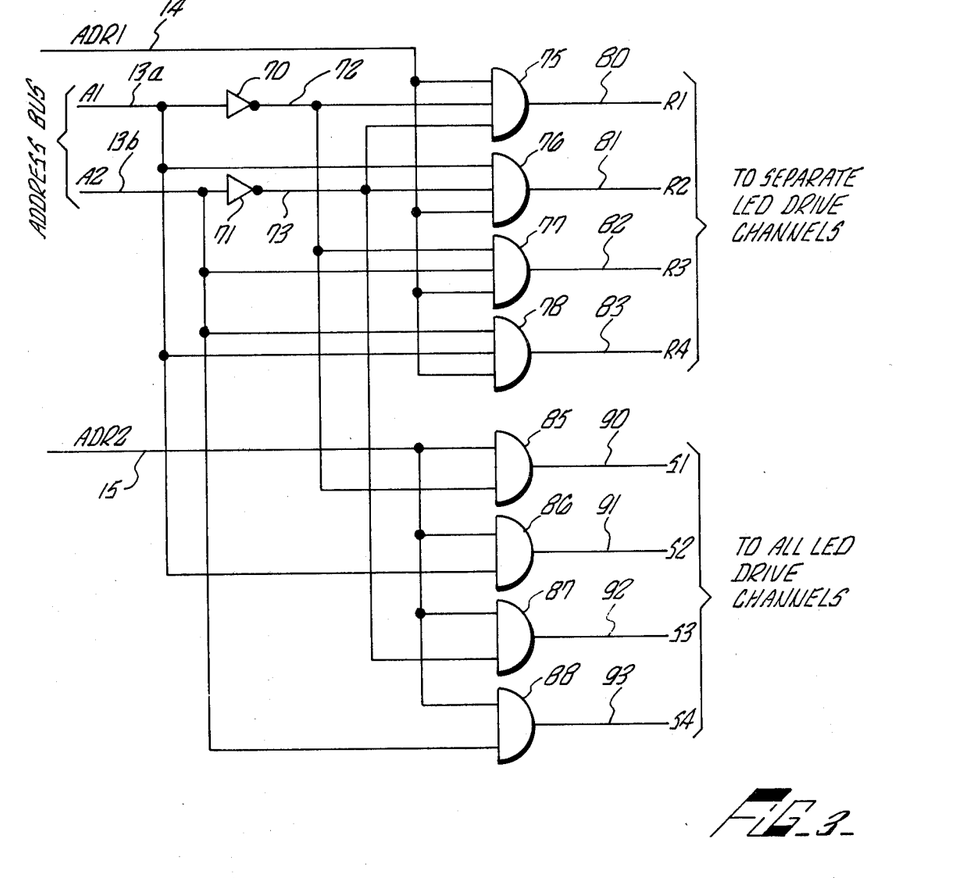
FIG. 3 is a logic diagram of the address decoding and selection unit shown in FIG. 1.

Referring now to FIG. 3, a two-bit address decoding and selection unit is illustrated which has the capability of controlling a four-input, four-output switch. The four by four configuration has been chosen to simplify the dicussion and in no way implies a restriction on the number of input and output lines which can be handled by the switch. The address information A1 and A2 enters the unit via lines 13a and 13b (forming address bus 13). Logic inverters 70 and 71 invert the signals on lines 13a and 13b, producing the logical complement on lines 72 and 73, respectively. The four possible combinations of the address bits A1 and A2 are provided with four AND gates 75, 76, 77, and 78. Thus, when ADR1 is a logic level ONE, the information on the address bus lines 13a and 13b will be decoded by AND gates 75 – 78 resulting in a logic level ONE being generated on one of the lines 80 – 83 which serve as control lines R1 through R4, each being connected to one of the LED drive channels. Thus, when ADR1 is a ONE, the address information is interpreted as an input line address.

The address bits A1 and A2 and their complements are combined with the ADR2 signal on line 15 in the AND gates 85, 86, 87, and 88 to produce the four LED select or enabling signals S1, S2, S3, and S4 on lines 90, 91, 92, and 93, respectively. These lines are connected to all LED drive channels in parallel.

Figure 4:
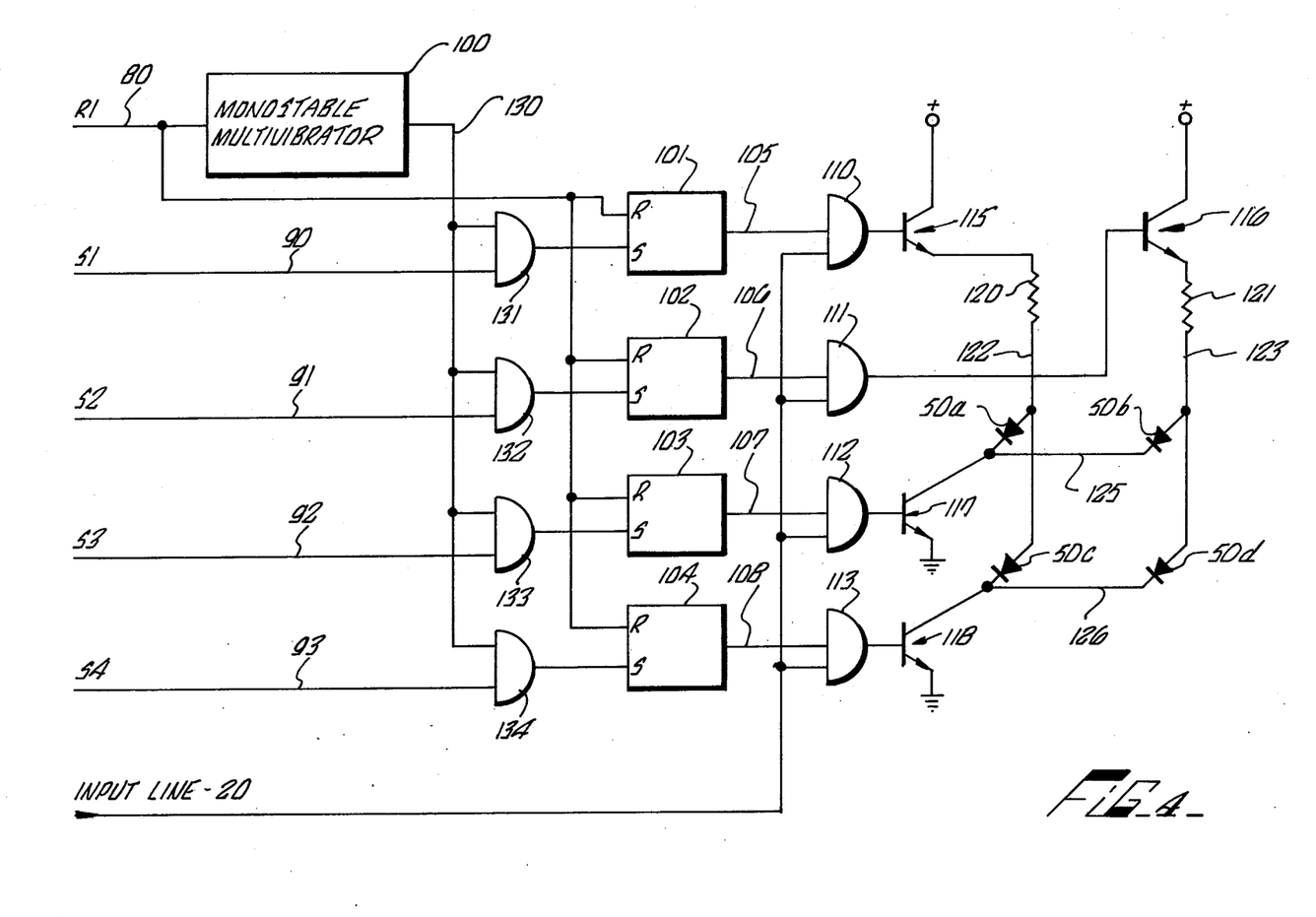
FIG. 4 is a logic diagram of the light emitting diode drive circuit shown in FIG. 1.

FIG. 4 is a diagram of a single LED drive channel. The control line signal, R1 in the illustration shown on line 80 triggers a monostable multivibrator 100 which could be a commonly available 74121 integrated circuit. The signal on line 80 also serves as a reset signal to four flip-flops or bistable multivibrators 101, 102, 103, and 104. The outputs of the flip-flops on lines 105, 106, 107, and 108 are combined with the input signal on line 20 at the AND gates 110, 111, 112, and 113. The outputs of AND gates 110 and 111 are used to control transistors 115 and 116, respectively. These two transistors provide drive current through resistors 120 and 121 to column lines 122 and 123, respectively. The outputs of AND gates 112 and 113 are used to control transistors 117 and 118, respectively. These two transistors serve as current sinks for the two row lines 125 and 126, respectively. The LED 50a is connected to column line 122 and row line 125 in such a polarity that current will flow through it in the forward direction when transistors 115 and 117 are turned on. This flow of current will cause the LED 50a to emit optical radiation. Similarly, LED 50b is activated by transistors 116 and 117, LED 50c by transistors 115 and 118, and LED 50d by transistors 116 and 118. In only one column line and one row line are driven at any given time, only the one LED at the intersection of that row and column will draw current and product optical radiation. Thus, the signal on input line 20 will be optically connected to only one output photosensor, and hence, to one output line. The input signal can also be connected to more than one output line at the same time by similar means.

The purpose of the monostable vibrator 100 is to provide a gating signal on line 130 for a specified length of time while the unit waits for the select or enabling signals on lines 90 – 93. These signals are combined with the signal on line 130 at AND gates 131, 132, 133, and 134, causing the flip-flops 101 – 104 to be set when the output of the AND gates are a logic level ONE. This setting action causes the selected row and column drivers to be activated and to remain activated or enabled until the flip-flop register is again reset prior to new row and column select information being received from the address decoding and selection unit.

FIG. 4 shows a means of switching digital or logic level signals. Switching of analog or continuous level signals can be accomplished in a similar fashion with, for example, the AND gates 110 – 113 replaced by field effect transistor devices. The LEDs could be biased to operate over a specified dynamic range of power output, a push-pull arrangement could be used or various modulation schemes could be used. Linear operation could be enhanced by utilizing one or more photosensors located at or near the relay lens for each LED array to provide an electrical feedback signal.

Figure 5:
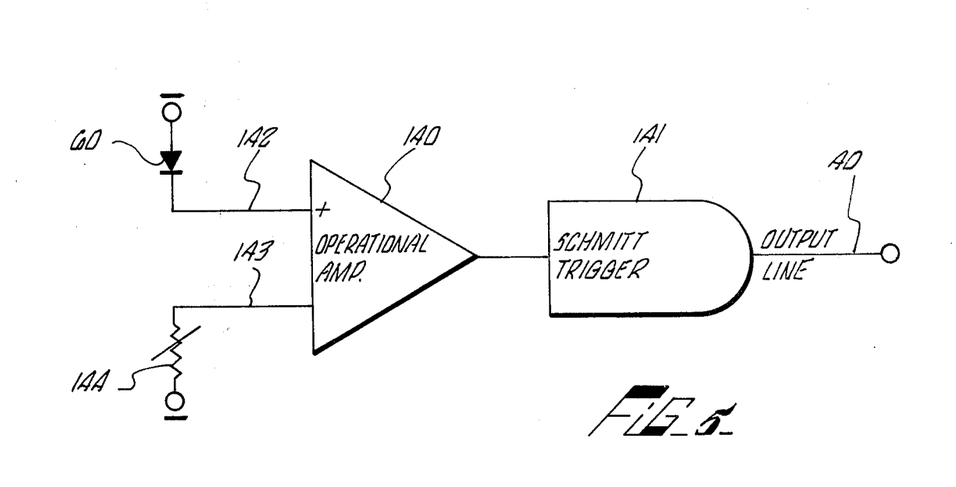
FIG. 5 is a diagram of one channel of the output electronics shown in FIG. 1.

FIG. 5 is a diagram of one output channel, including the photosensor 60, an amplifier 140 for boosting the signal, and a Schmitt trigger 141 for converting the amplified signal to a logic level on the output line 40. For illustrative purposes, the photosensor shown is a back-biased photodiode 60. Current from the photodiode 60 flows in line 142 to the operational amplifier 140. The negative input is connected through line 143 to a variable resistor 144 used to offset the dark current of the photodiode 60.

FIG. 5 illustrates an output channel for logic level signals. Analog signals can be handled in a similar fashion by eliminating the Schmitt trigger.

In the above embodiment, four inputs and four outputs were considered. However, it should be understood that many inputs and outputs could be handled in similar fashion within a single-level switching configuration and that multiple switches can be interconnected to provide multiple-level switching of many more inputs and outputs.

In the above embodiment, a lens system was used to direct the light from the individual LEDs to the individual photosensors. However, it should be understood that other means, including the use of fiber optics rods or bundles, can be used for this purpose.

In the above embodiment, an array of LEDs was used for each input line and a single photosensor used for each output line. However, it is to be understood that the dual of the system is an alternate embodiment, where a single LED located in the focal plane of the objective lens is associated with each input line and an array of photosensors located in the focal plane of its relay lens is associated with each input line. In this alternate embodiment, each LED is driven directly from its input line and the row-column select information is used to select the photosensor within a given array which will send signals to the output amplifier.

In FIG. 6, another embodiment of the optical crosspoint switch is illustrated in which one light emitting diode is coupled to each input circuit via an LED drive circuit 150 and a separate array of photosensor units is coupled to each output circuit via output amplifier circuit 152. In the figure, the array of light emitting diode units is referenced by the numeral 154 and includes four light emitting diodes. Thus, in the embodiment of FIG. 6, n is equal to 4. A fiber optic bundle 156 optically connects the LED units 154 to n arrays of photosensor units 158.

Figure 7:
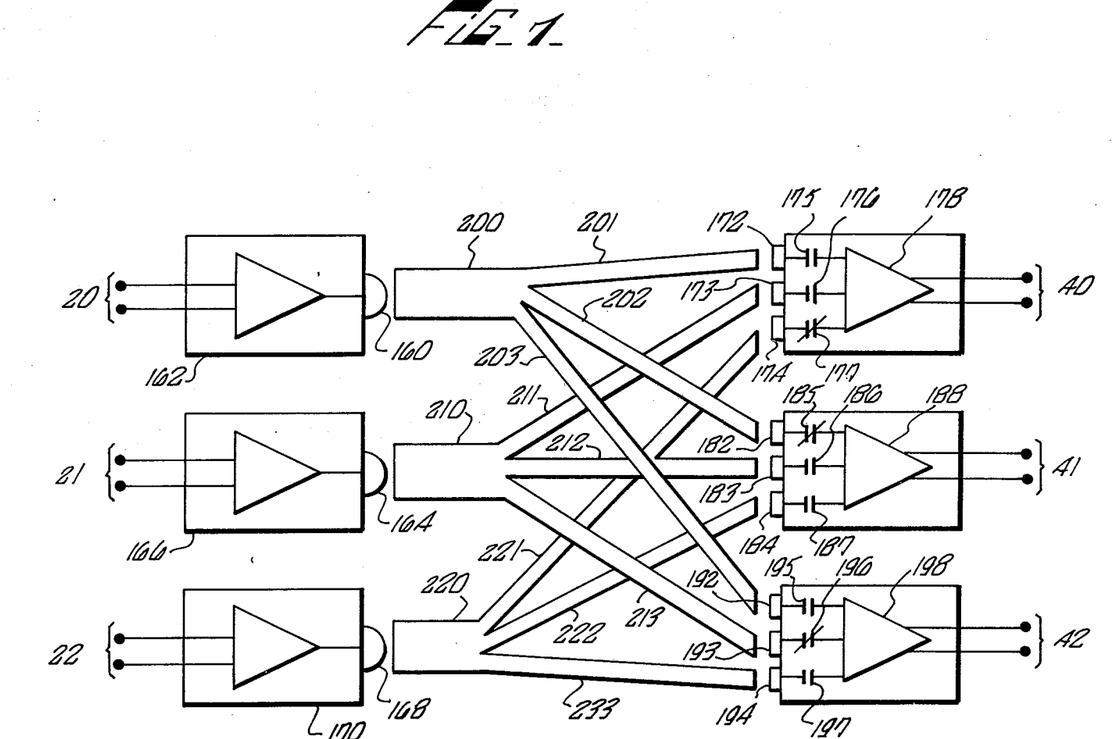
FIG. 7 is a diagram illustrating the use of fiber optic bundles connecting the light emitting unit of FIG. 6 to each array of light sensor units.

Referring now to FIG. 7, there is illustrated a group of fiber optic bundles for coupling the optical radiation from each light emitting diode to all of the arrays of photosensor units. Only three input circuits and three output circuits are illustrated for simplicity in FIG. 7. A light emitting diode 160 is connected to input circuit 20 through a LED drive amplifier 162. A light emitting diode 164 is connected to input circuit 21 via drive amplifier 166 and light emitting diode 168 is connected to input circuit 22 by a LED drive amplifier 170. The amplifiers 162, 166, and 170 are a part of LED drive circuit 150.

Three photosensor diodes 172, 173, and 174 comprise one array and are connected to output circuit 40 via photosensor gates, or switches, 175, 176, and 177 and an output amplifier 178 as illustrated. Three photosensor units 182, 183, and 184 comprise a second array and are connected to output circuit 41 via photosensor gates 185, 186, and 187, and output amplifier 188, as shown. Three photosensor units 192, 193, and 194 comprise a third array and are connected to output circuit 42 via photosensor gates 195, 196, and 197 and output amplifier 198 as illustrated. The photosensor gates may be controlled by the address decoding and selection unit 16 as was discussed in connection with FIGS. 3 and 4.

The photosensor gates 177, 185, and 196 are illustrated in the closed position and the other photosensor gates are illustrated in the open position. Fiber optic bundles 200, 210, and 220 connect the light emitting diodes to the arrays of photosensor units. For example, the fiber optic bundle 220 includes legs 221, 222, and 223 for direct light from LED 168 to photosensor units 174, 184, and 194. Thus, the fiber optic bundles optically couple each LED to all of the arrays of photosensor units. With the photosensor gates operated as shown in FIG. 7, the input circuit 22 is connected to the output circuit 40, the input circuit 21 is connected to the output circuit 42, and the input circuit 20 is connected to the output circuit 41. The photosensor gates may be selectively enabled (closed) to connect any input circuit to one or more selected output circuits.

A simple and extremely fast optical cross-point switch has been described. Various modifications to the illustrated preferred embodiments will be obvious to those skilled in the art without involving any departures from the scope of my invention.

What is claimed is:

1. In an optical cross-point switch, the combination which comprises:
    a plurality of separate input circuits;
    a plurality of separate output circuits;
    an optical matrix connected between the input and output circuits, the matrix including a first set of light emitting units associated with the input circuits and a second set of light sensor units associaed with the output circuits, one of the first and second sets having a number of $n$ units, where $n$ equals an integer, and the other set having a number of arrays of units with each array having a number of $n$ units, one unit in each array of the other set being individually associated with one unit of said one set, each unit of the first set being coupled to a separate input or output circuit and each array of the second set being coupled to a separate input or output circuit, each light emitting unit being arranged to convert an electrical signal into a light signal, each light sensor unit being arranged to convert a light signal into an electrical signal;
    means for transmitting light signals between each unit of said one set and the associated unit in each array of the other set so that each input circuit may be selectively coupled to any desired output circuit; and
    means for selectively enabling one unit of each array to thereby connect selected input circuits to selected output circuits.

2. The combination as defined in claim 1 wherein said one set comprises the light sensor units with one light sensor light sensor unit being coupled to each output circuit and wherein said other set comprises the light emitting units with a separate array of light emitting units being coupled to each input circuit.

3. The combination as defined in claim 1 wherein said one set comprises the light emitting units with one light emitting unit being coupled to each input circuit and wherein said other set comprises the light sensor units with a separate array of light sensor units being coupled to each output circuit.

4. The combination as defined in claim 1 wherein the means for transmitting the light signals between the light emitting and sensor units comprises fiber optic bundles.

5. The combination as defined in claim 1 wherein the means for transmitting the light signals between the light emitting and sensor units comprises a plurality of lenses.

6. The combination as defined in claim 1 wherein the light emitting units are light emitting diodes.

7. In an optical cross-point switch, the combination which comprises:
    a plurality of separate input circuits;
    a plurality of separate output circuits;
    an optical matrix connected between the input and output circuits, the matrix including n light emitting units, where n equals an integer, and a set of arrays of light sensor units, one light emitting unit being coupled to each input circuit, one array of light sensor units being coupled to each output circuit, each array of light sensor units having n light sensor units, one light sensor unit in each array being individually associated with one light emitting unit, each light emitting unit being arranged to convert an electrical signal into a light signal, each light sensor unit being arranged to convert a light signal into an electrical signal;
    means for transmitting light signals between each light emitting unit and the associated light sensor unit in each array of the other set so that each input circuit may be selectively coupled to any desired output circuit; and
    means for selectively enabling at least one light sensor unit of each array to thereby connect selected input circuits to selected output circuits.

8. The combination as defined in claim 7 wherein the means for selectively enabling light sensor units comprises a binary address decoding and selection circuit.

9. The combination as defined in claim 7 wherein the means or transmitting light signals between the light emitting and sensor units comprises fiber optic bundles.

10. The combination as defined in claim 7 wherein the means for transmitting light signals between the light emitting and sensor units comprises a plurality of lenses.

11. The combination as defined in claim 10 wherein the plurality of lenses includes a separate relay lens for each array of light sensor units and an objective lens.

12. The combination as defined in claim 7 wherein the light emitting units are light emitting diodes.

13. The combination as defined in claim 7 wherein n equals the number of input and output circuits.

14. In an optical cross-point switch, the combination which comprises:
    a plurality of separate input circuits;
    a plurality of separate output circuits;
    an optical matrix connected between the input and output circuits, the matrix included $n$ arrays of light emitting units and $n$ light sensor units, where $n$ equals an integer, one array of light emitting units being connected to each input circuit, one light sensor unit being connected to each output circuit, each light emitting unit being arranged to convert an electrical signal applied to the associated input circuit into a light signal, each light sensor unit being arranged to convert a light signal incident thereon into an electrical signal;
    one unit in each array of light emitting units being associated with one light sensor unit whereby each of said light sensor units will be illuminated with light from said associated light emitting unit;

means for transmitting light signals between each light emitting unit in each array of light emitting units and the associated light sensor unit; and means for selectively enabling at least one light emitting unit of each array to thereby connect selected input circuits to selected output circuits.

15. The combination as defined in claim 14 wherein the means for selectively enabling light sensor units comprises a binary address decoding and selection circuit.

16. The combination as defined in claim 14 wherein the means for transmitting light signals between the light emitting and sensor units comprises fiber optic bundles.

17. The combination as defined in claim 14 wherein the means for transmitting light signals between the light emitting and sensor units comprises a plurality of lenses.

18. The combination as defined in claim 17 wherein the plurality of lenses includes a separate relay lens for each array of light sensor units and an objective lens.

19. The combination as defined in claim 14 wherein the light emitting units are light emitting diodes.

20. The combination as defined in claim 14 wherein n equals the number of input and output circuits.

* * * * *